US009444460B1

(12) United States Patent
Lane

(10) Patent No.: US 9,444,460 B1
(45) Date of Patent: Sep. 13, 2016

(54) INTEGRATED CIRCUITS WITH PROGRAMMABLE OVERDRIVE CAPABILITIES

(71) Applicant: Altera Corporation, San Jose, CA (US)

(72) Inventor: Christopher F. Lane, San Jose, CA (US)

(73) Assignee: Altera Corporation, San Jose, CA (US)

( * ) Notice: Subject to any disclaimer, the term of this patent is extended or adjusted under 35 U.S.C. 154(b) by 200 days.

(21) Appl. No.: 14/087,493

(22) Filed: Nov. 22, 2013

(51) Int. Cl.
*G06F 7/38* (2006.01)
*H03K 19/00* (2006.01)

(52) U.S. Cl.
CPC ................................. *H03K 19/0016* (2013.01)

(58) Field of Classification Search
None
See application file for complete search history.

(56) References Cited

U.S. PATENT DOCUMENTS

| | | | |
|---|---|---|---|
| 5,122,846 A | 6/1992 | Haken | |
| 5,642,315 A | 6/1997 | Yamaguchi | |
| 5,801,551 A | 9/1998 | Lin | |
| 6,025,737 A | 2/2000 | Patel et al. | |
| 6,262,893 B1 | 7/2001 | Liu | |
| 6,335,893 B1 | 1/2002 | Tanaka et al. | |
| 6,366,224 B2 | 4/2002 | Cliff et al. | |
| 6,433,585 B1 | 8/2002 | Patel et al. | |
| 6,483,165 B2 | 11/2002 | Ooishi et al. | |
| 6,489,804 B1* | 12/2002 | Burr | H03K 19/17728 326/38 |
| 6,519,191 B1 | 2/2003 | Morishita | |
| 6,643,162 B2 | 11/2003 | Takeuchi et al. | |
| 6,724,222 B2 | 4/2004 | Patel et al. | |
| 6,777,978 B2 | 8/2004 | Hart et al. | |
| 6,795,332 B2 | 9/2004 | Yamaoka et al. | |
| 6,882,205 B2* | 4/2005 | Curran | G06F 1/32 327/291 |
| 6,897,679 B2 | 5/2005 | Cliff et al. | |
| 7,180,334 B2 | 2/2007 | Starr | |
| 7,266,028 B1 | 9/2007 | Ghosh Dastidar | |
| 7,276,932 B2 | 10/2007 | Kuang et al. | |
| 7,277,351 B2* | 10/2007 | Liu | H03K 19/17784 365/226 |
| 7,358,764 B1 | 4/2008 | Chan et al. | |
| 7,411,853 B2 | 8/2008 | Liu et al. | |
| 7,430,148 B2 | 9/2008 | Liu et al. | |
| 7,463,057 B1 | 12/2008 | Rahim et al. | |
| 7,547,947 B2* | 6/2009 | Anderson | H01L 27/11 257/369 |
| 7,800,402 B1* | 9/2010 | Rahim | H03K 19/17728 326/113 |
| 8,072,237 B1* | 12/2011 | Rahim | H03K 19/17784 326/101 |
| 8,258,572 B2* | 9/2012 | Liaw | H01L 27/0207 257/327 |
| 8,395,440 B2* | 3/2013 | Sandhu | H03K 17/145 327/540 |
| 8,633,731 B1* | 1/2014 | Rahim | H03K 19/1733 326/113 |
| 2005/0280437 A1 | 12/2005 | Lewis et al. | |
| 2007/0109017 A1 | 5/2007 | Liu et al. | |
| 2007/0109899 A1 | 5/2007 | Liu et al. | |
| 2007/0113106 A1 | 5/2007 | Liu et al. | |

OTHER PUBLICATIONS

Yanzhong Xu, U.S. Appl. No. 13/360,585, filed Jan. 27, 2012.
Rahim et al., U.S. Appl. No. 12/332,928, filed Dec. 11, 2008.

* cited by examiner

*Primary Examiner* — Alexander H Taningco
*Assistant Examiner* — Nelson Correa
(74) *Attorney, Agent, or Firm* — Treyz Law Group; Jason Tsai

(57) ABSTRACT

Integrated circuits are provided with circuitry such as multiplexers that can be selectively configured to route different power supply voltages to different circuit blocks on the integrated circuits. The circuit blocks may contain memory elements that are powered by the power supply voltages and that provide corresponding static output control signals at magnitudes that are determined by the power supply voltages. The control signals from the memory elements may be applied to the gates of transistors in the circuit blocks. Logic on an integrated circuit may be powered at a given power supply voltage level. The memory elements may provide their output signals at overdrive voltage levels that are elevated with respect to the given power supply voltage level during high speed operation and may provide their output signals at relatively lower voltage levels that are less than the overdrive voltage during low power operation.

14 Claims, 7 Drawing Sheets

INTEGRATED CIRCUITS WITH PROGRAMMABLE OVERDRIVE CAPABILITIES

BACKGROUND

This relates to integrated circuits, and more particularly, to circuitry for integrated circuits that can be used to improve performance and reduce power consumption by selectively overdriving pass transistors.

Integrated circuits such as programmable integrated circuits often contain volatile memory elements. Typical volatile memory elements are based on cross-coupled inverters (latches) and are used to store data. These volatile memory elements are often used to store configuration data. Programmable integrated circuits, in particular, can be customized in relatively small batches to implement a desired logic design.

The memory elements in a programmable logic device produce static output signals that reflect the configuration data that has been loaded into the memory elements. The static output signals drive the gates of n-channel and p-channel transistors, which are often used as pass transistors and are incorporated into multiplexers and other logic components. Depending on the current application of the programmable integrated circuit, it may be desirable to operate the pass transistors in a high speed mode or in a low power mode.

To accommodate operation in both the high speed mode and the low power mode, some integrated circuit designs use body biasing arrangements in which the bulk or body terminals of certain transistors in the circuit are biased to adjust the transistors' threshold voltage. For example, bulk voltage adjustments that decrease the transistors' threshold voltage may place the integrated circuit in the high speed mode, whereas bulk voltage adjustments that increase the transistors' threshold voltage may place the integrated circuit in the low power mode (i.e., by reducing leakage).

Although techniques such as these help to reduce power consumption while preserving device performance, it is not always possible to bias the body terminal of transistors in active circuits.

SUMMARY

Integrated circuits may be provided with programmable overdrive capabilities. An integrated circuit may, for example, include a memory element (e.g., a volatile memory cell) having an output terminal and a power supply terminal, logic circuitry having at least one pass transistor with a gate terminal that receives a static control voltage from the output terminal of the memory element, a first power supply line on which a first control voltage is provided, a second power supply line on which a second control voltage is provided, and a multiplexer that is configured to route a selected one of the first and second control voltages to the power supply terminal of the memory element.

The first control voltage may be used to overdrive the pass transistor (i.e., so that signals propagating through the logic circuitry can swing rail-to-rail), whereas the second control voltage does not overdrive the pass transistor (i.e., so that signals propagating through the logic circuitry does not swing full rail). In general, signals being passed through the logic circuitry may be driven using a driver circuit so that the signals swing full rail between a nominal positive power supply voltage level and a ground voltage level.

The pass transistor may have an associated threshold voltage. The first control voltage may be at least one threshold voltage greater than the nominal positive power supply voltage level (e.g., the first control voltage may be equal to at least the sum of the nominal positive power supply voltage level and the threshold voltage level). The second control voltage may be less than the sum of the nominal positive power supply voltage level and the threshold voltage level. If desired, the second control voltage may have a voltage level that is equal to the nominal positive power supply voltage level.

The pass transistor may be implemented using a planar transistor or a nonplanar Fin field effect transistor. The pass transistor may be overdriven using the first control voltage to improve the performance of the logic circuitry or may be driven using the second control voltage to reduce power consumption.

In general, the logic circuitry may include a routing wire that is coupled between two logic regions on the integrated circuit. The routing path may have a first (transmit) end that is coupled to a first multiplexing circuit in a first logic region and a second (receive) end that is coupled to a second multiplexing circuit in a second logic region. The first and second multiplexing circuits may be formed using pass transistors. A driver circuit may be used to output a signal that swings full rail. The output signal may be fed through the first multiplexing circuit, the routing wire, and the second multiplexing circuit in that order so that the output signal is routed from the first logic region to the second logic region.

The integrated circuit may be operated in a first mode during which the pass transistors in the first multiplexing circuit are controlled using the first (overdrive) control voltage while the pass transistors in the second multiplexing circuit are controlled using the second (reduced) control voltage. The integrated circuit may also be operated in a second mode during which the pass transistors in the first multiplexing circuit are controlled using the second control voltage while the pass transistors in the second multiplexing circuit are controlled using the first control voltage. The integrated circuit may also be operated in a third (low power) mode during which the pass transistors in the first and second multiplexing circuits are controlled using the second control voltage. The integrated circuit may also be operated in a fourth (high speed) mode during which the pass transistors in the first and second multiplexing circuits are controlled using the first control voltage.

Further features of the present invention, its nature and various advantages will be more apparent from the accompanying drawings and the following detailed description.

DETAILED DESCRIPTION

Embodiments of the present invention relate to integrated circuits, and more particularly, to integrated circuits with memory elements that can be used to provide adjustable overdrive control signals to multiplexing circuitry. It will be recognized by one skilled in the art, that the present exemplary embodiments may be practiced without some or all of these specific details. In other instances, well-known operations have not been described in detail in order not to unnecessarily obscure the present embodiments.

Figure 1:
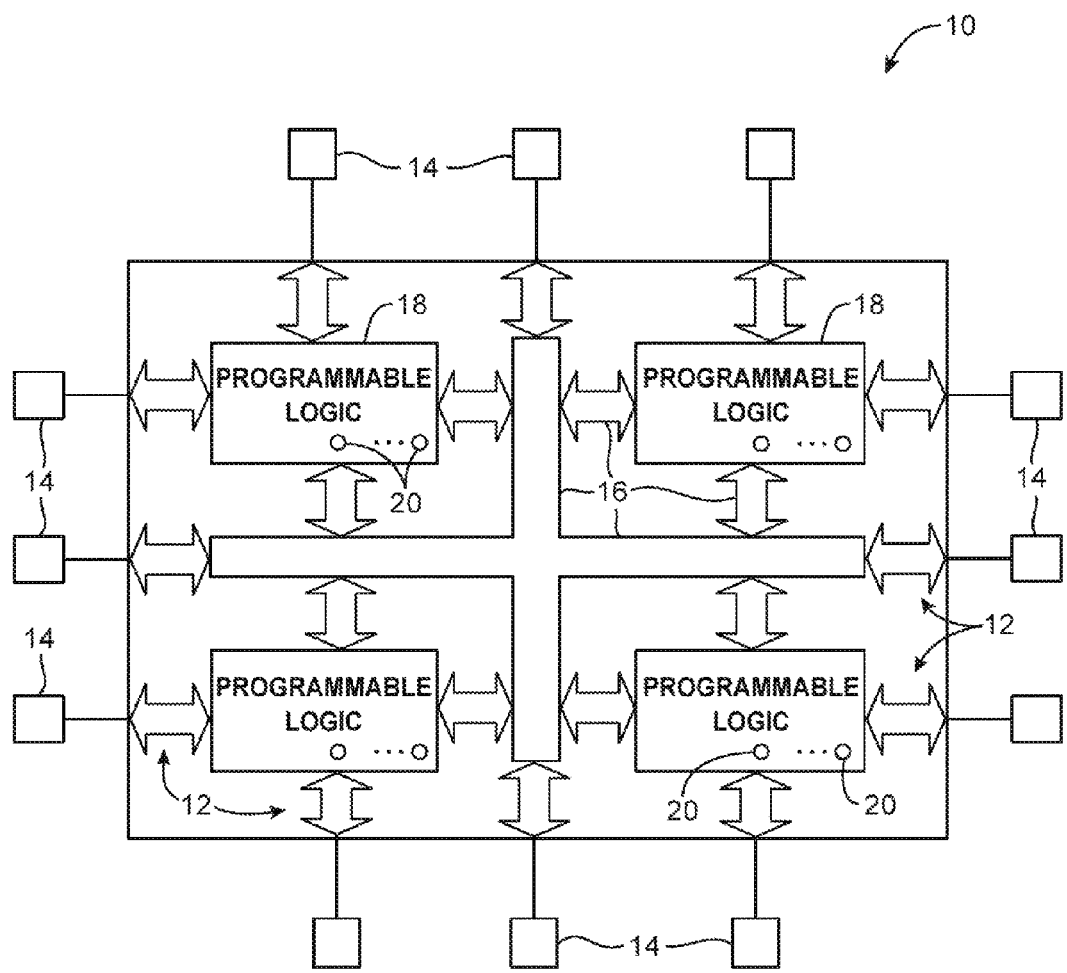
FIG. 1 is a diagram of an illustrative programmable integrated circuit in accordance with an embodiment of the present invention.

An illustrative integrated circuit of the type that may be provided with memory elements and associated circuits that can be controlled using output signals from the memory elements is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry (programmable logic) 18.

Because memory elements 20 may be used in storing configuration data for programmable logic 18, memory elements 20 may sometimes be referred to as configuration random-access memory elements (CRAM). Integrated circuit 10 may be configured to implement custom logic functions by configuring programmable logic 18, so integrated circuit 10 may sometimes be referred to as a programmable integrated circuit or a programmable logic device (PLD).

As shown in FIG. 1, programmable integrated circuit 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, NAND gates, etc. P-channel transistors (e.g., a p-channel metal-oxide-semiconductor pass transistor) may also be controlled by output signals from memory elements 20, if desired. When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

Figure 2:
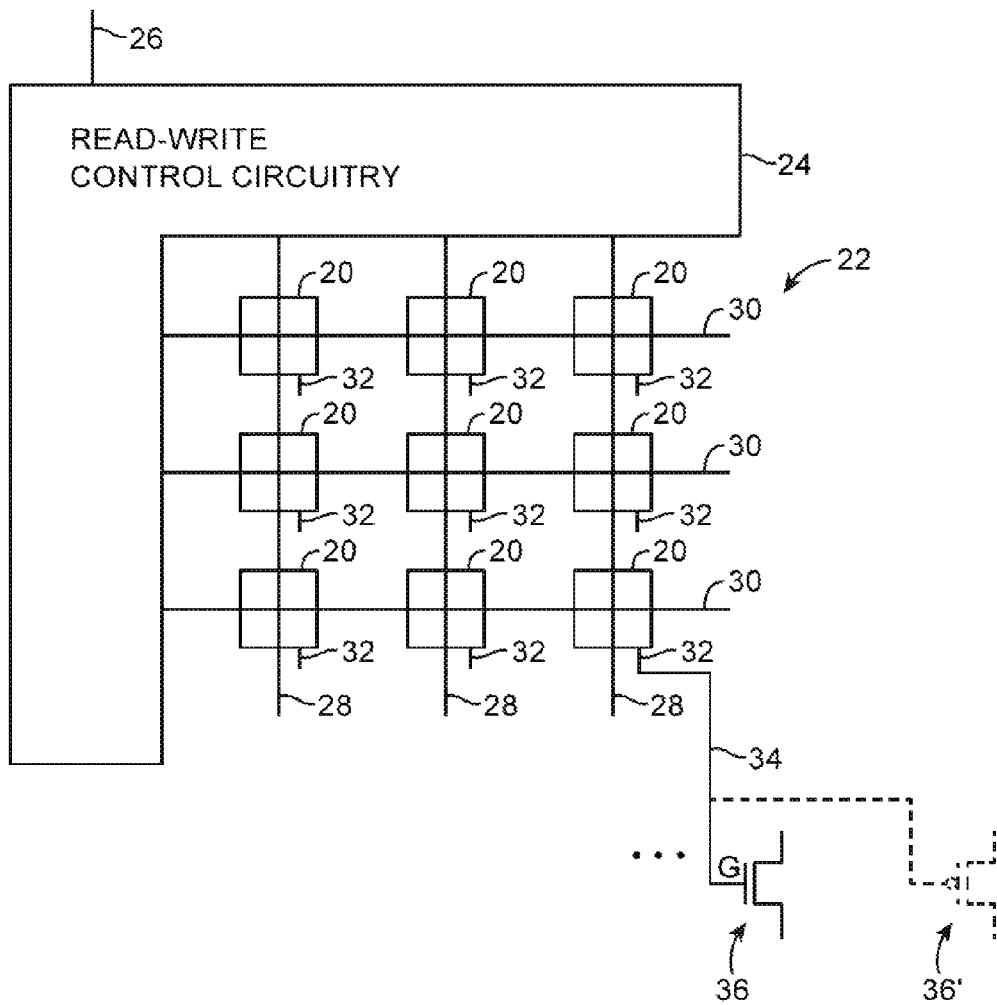
FIG. 2 is a diagram of illustrative memory circuitry in accordance with an embodiment of the present invention.

Horizontal and vertical conductive lines and associated control circuitry may be used to write data into the memory elements and may be used to read data from the memory elements. An illustrative arrangement that allows data to be written into and read from an array of memory elements is shown in FIG. 2. Illustrative array 22 of FIG. 2 has memory elements 20. Memory elements 20 may be volatile memory elements such as CRAM cells. Each memory element 20 may have a corresponding output 32 with which a corresponding static output signal may be applied to the gate of a corresponding programmable transistor. For example, a path such as path 34 may be used to apply an output signal from the output 32 of a memory element 20 to a gate G of a corresponding programmable transistor (pass gate) such as pass gate 36. The programmable transistor may be an n-channel transistor such as transistor 36 of FIG. 2 or may be a p-channel transistor (see illustrative pass gate 36' of FIG. 2).

The arrangement of FIG. 2 has a 3×3 array 22 of memory elements 20. Device 10 may, if desired have more rows and columns (e.g., hundreds or thousands of rows and columns). A 3×3 array of FIG. 2 is merely illustrative and does not serve to limit the scope of the present invention.

Read-write control circuitry 24 may obtain data to be loaded into array 22 via path 26. Data that has been read from array 22 may be provided to path 26 from memory elements 20 by read-write control circuitry 24.

Control signals on one or more control lines 30 may be used to control reading and writing operations. For example, during writing and reading operations, signals on address lines in lines 30 (sometimes referred to as word lines) may be asserted to control associated address transistors. If desired, control lines 30 may include clear lines. A clear signal may be asserted on the clear lines when it is desired to clear the contents of the memory elements 20 in array 22 (e.g., when it is desired to clear all of the memory elements in a block of memory elements simultaneously).

Data lines 28 (sometimes referred to as bit lines) may be used in conveying data from read-write control circuitry 24 to memory elements 20 during data loading operations. Data lines 28 may also be used in conveying data from memory elements 20 to read-write control circuitry 24 during data reading operations. The memory elements that are selected during reading and writing operations may be controlled by the address lines (lines 30).

There may be any suitable number of address lines and data lines associated with each memory element 20. For example, each memory element in a row of memory elements may be associated with a single address line that is used for controlling both reading and writing operations or may be associated with a write address line for use during write operations and a read address lines for use during read operations. One data line may be associated with each memory element in a column of memory elements or a pair of complementary data lines may be associated with each memory element in a column of memory elements (as examples).

As described above, device 10 may include different logic regions that are interconnected using programmable routing circuits of different lengths. The routing circuits may include switching circuitry and driver circuitry for routing and driving data and control signals along horizontal routing paths (sometimes referred to as "H" lines) from one logic region to another along the same row and for routing and driving data and control signals along vertical routing paths (sometimes referred to as "V" lines) from one logic region to another logic region in a different row.

Figure 3:
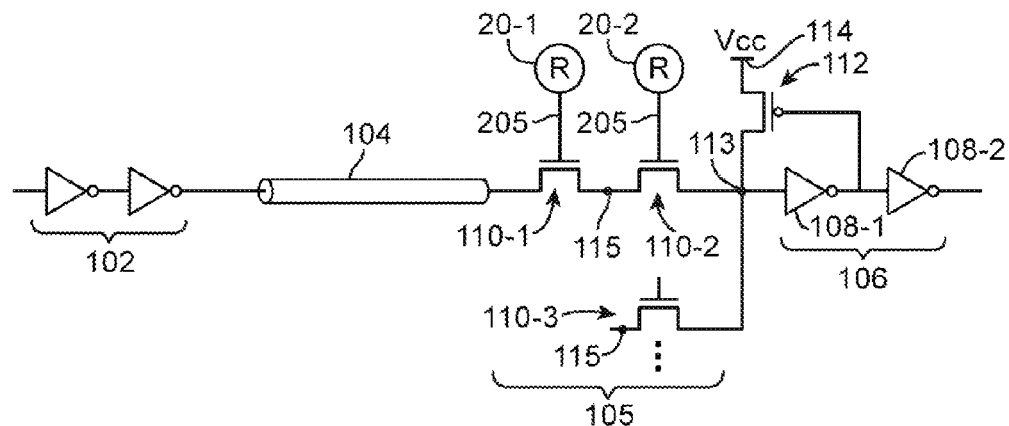
FIGS. 3 and 4 are diagrams of illustrative routing driver and multiplexing circuitry in accordance with an embodiment of the present invention.

FIG. 3 shows such a routing channel 104 that can be used to convey data and control signals between two separate logic blocks. In the example of FIG. 3, driver circuit 102 that is sometimes considered to be part of a logic block may be used to drive signals onto routing path 104. Driver circuit 102 may include at least two series-connected inverting circuits (as an example).

In general, routing path 104 can have any suitable length. Routing path 104 may have a first terminal that is coupled to driver circuit 102 in a first logic block and a second terminal that is coupled to receiver circuitry in a second logic block. The length of routing path 104 may depend on the amount of circuitry that path 104 traverses when routing signals from the first (source) logic block to the second (destination) logic block. For example, routing path 104 that traverses one intervening logic blocks in the horizontal direction may be referred to as an H2 wire. As another example, routing path 104 that traverse three intervening logic blocks in the vertical direction may be referred to as a V4 wire. As described above, each source logic region may have driver circuits that drive signals onto a corresponding channel 104 with an appropriate drive strength based on the lengths and widths of the interconnects and/or other physical characteristics of the interconnects.

Each logic region may also include receiver circuitry for receiving signals from various routing channels 104. As shown in FIG. 3, the receiver circuitry may include at least multiplexing circuitry 105 and a receiver circuit 106. Multiplexing circuitry 105 may be formed using pass gate transistors such as pass transistors 110-1 and 110-2. Pass transistors 110-1 and 110-2 of FIG. 3 are shown as n-channel transistors but may also be implemented using p-channel transistors, if desired. When implementing the pass transistors using p-channel transistors, the p-channel transistor may have gates that receive a selected one of a ground power supply signal (Vss) and a reduced ground power supply signal (e.g., a power supply voltage that is at least one threshold voltage Vtp less than Vss).

In particular, transistors 110-1 and 110-2 may be coupled in series through their source-drain terminals between routing path 104 and receiver circuit 106. The node at which transistors 110-1 and 110-2 are connected may be referred to as an internal node 115 of multiplexer 105. Transistor 110-1 may have a gate terminal that receives a first control signal from a first memory element 20-1, whereas transistor 110-2 may have a gate terminal that receives a second control signal from a second memory element 20-2. A signal may be passed from routing channel 104 to receiver 106 only when the first and second control signals are asserted (i.e., multiplexer 105 actively routes signals from path 104 to receiver 106 only when transistors 110-1 and 110-2 are turned on).

In general, receiver 106 may receive signals from other routing wires via additional pass transistors such as pass transistor 110-3. Pass transistor 110-3 may also be selectively enabled using an associated memory element at its gate (not shown). The routing wires that terminate at this particular multiplexer 105 need not originate from the same source logic region (e.g., multiplexing circuit 105 may be coupled to routing channels of various lengths and that are routed from different logic rows and columns). Arranged in this way, multiplexing circuitry 105 may be configured to receive signals from a selected one of the different routing channels that are being routed to that particular logic block.

Referring still to FIG. 3, receiver circuit 106 may include inverting circuits 108-1 and 108-2 coupled in series and a pull-up circuit such as p-channel transistor 112. P-channel transistor 112 may have a source terminal that is coupled to a positive power supply line 114 (e.g., a power supply line on which positive power supply voltage Vcc is provided), a drain terminal that is coupled to the input of inverter 108-1, and a gate terminal that is coupled to the output of inverter 108-1. The input of inverter 108-1 to which the drain terminal of transistor 112 is connected may serve as an input port 113 for receiver 106. Connected in this way, pull-up transistor 112 may serve to pull input node 113 all the way up to power supply voltage Vcc whenever multiplexing circuitry 105 is passing a high voltage signal to receiver 106. In other words, even if signals passing though transistor 110-2 does not swing full rail, transistor 112 serves as a level shifter to drive the signals all the way up to Vcc.

P-channel transistor 112 used in this way may help improve circuit performance because n-channel pass transistors, while proficient at passing low voltage signals, experience a threshold voltage drop when passing high voltage signals. Regardless whether or not the voltage at input 113 is driven to the full logic "1" or logic "0" level, inverter 108-1 will drive the received signal to the full logic high or logic low level. Receiver 106 configured as such is sometimes referred to as a logic region input buffer or a logic region input latch.

Figure 4:
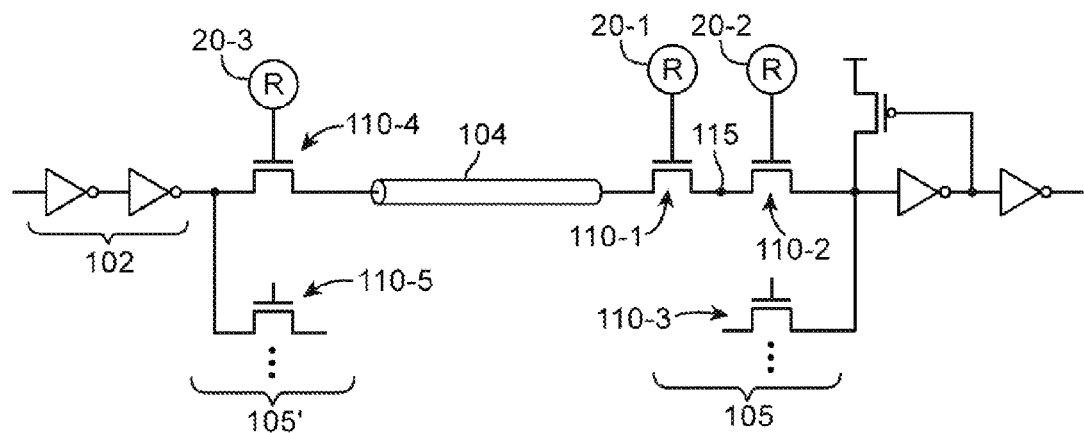

The circuit arrangement of FIG. 3 is merely illustrative and does not serve to limit the scope of the present invention. FIG. 4 shows another suitable arrangement in which additional multiplexing circuitry 105' is formed at logic region output driver 102. As shown in FIG. 4, multiplexing circuitry 105' may include at least one n-channel pass transistor 110-4 coupled between output driver 102 and routing wire 104. Pass transistor 110-4 may have a gate that receives a control signal from associated memory element 20-3. Signals may be allowed to pass from driver 102 to routing path 104 by configuring memory element 20-3 to store a logic high voltage signal. If desired, more than one pass transistor may be connected in series between driver 102 and routing wire 104. If desired, driver circuit 102 may be configured to drive more than one routing channel of various lengths by selectively enabling other pass transistors such as transistor 110-5.

As described above in connection with FIG. 3, the n-channel pass transistors 110 (e.g., pass transistors 110-1, 110-2, 110-3, 110-4, and 110-5) may experience a threshold voltage drop when passing high voltage signals. For example, consider a scenario in which an n-channel pass transistor with a threshold voltage Vtn is being used to pass a signal that swings between ground voltage Vss and positive power supply voltage Vcc (e.g., an incoming signal toggling between Vss and Vcc may be presented at a first source-drain terminal of the n-channel pass transistor). When the signal is at Vss, the n-channel pass transistor may successfully drive its second source-drain terminal all the way down to Vss. When the signal is at Vcc, the n-channel transistor can only drive its second source-drain terminal up to a level that is Vtn less than the voltage level applied at its gate terminal.

As an example, if an n-channel pass transistor receives at its gate terminal voltage Vcc, that pass-transistor can only drive its second source-drain terminal to (Vcc-Vtn). As a result, the internal nodes 115 of multiplexing circuitry 105 may not be able to swing full rail (i.e., the internal nodes of multiplexer 105 may not be driven completely up to Vcc).

In certain applications, it may be desirable for the pass transistors to swing full rail. In order to provide the multiplexing circuitry without any threshold voltage drop, an elevated or "boosted" voltage may be applied to the gate terminal of the n-channel pass transistors. As an example, the boosted voltage may have a voltage level that is at least Vtn higher than Vcc. Providing elevated control voltages to the n-channel pass transistors is sometimes referred to as "overdriving" the pass transistors and allows the n-channel pass transistors to drive its second source-drain terminal all the way up to Vcc (e.g., overdriving the pass transistors allows the internal nodes of multiplexing circuitry 105 to swing full rail).

In general, overdriving the pass transistors with higher gate voltage signals improves device performance at the expense of increased power consumption while applying nominal power supply voltage signal Vcc or gate voltage signals that are lower than the minimum overdrive voltage (e.g., the minimum elevated voltage to ensure full rail swing at the pass transistors) decreases power consumption at the expense of longer circuit delays. In accordance with an embodiment, it may be desirable to operate some of the pass transistors in high speed mode (i.e., by overdriving a portion of the pass transistors) and to operate some of the pass transistors in low power mode (i.e., by providing a lower gate voltage to another portion of the pass transistors).

Figure 5:
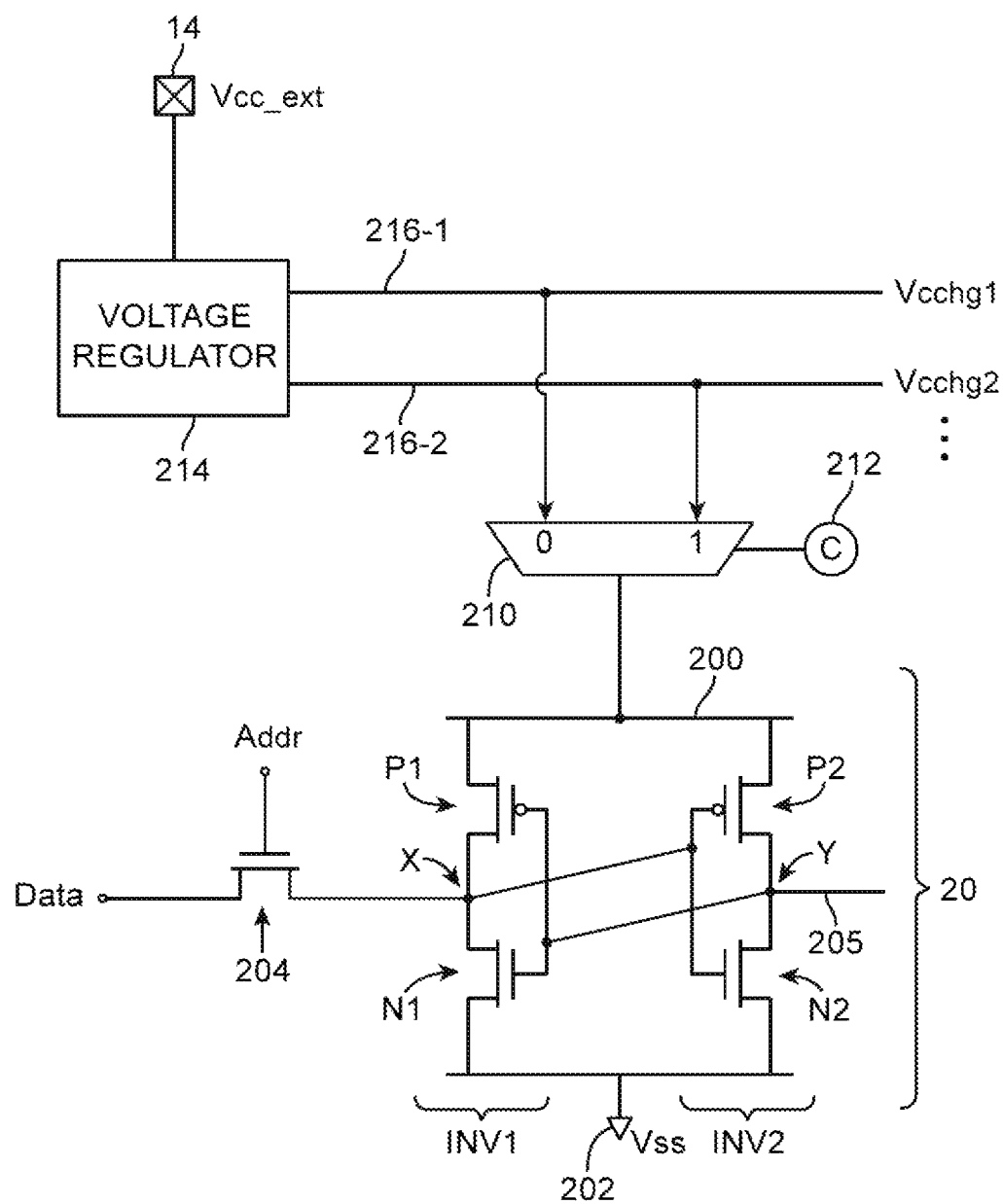
FIG. 5 is a diagram of an illustrative memory element for use in providing a static control signal to corresponding multiplexing circuitry in accordance with an embodiment of the present invention.

To enable the pass transistors to operate in the high speed mode and the low power mode, memory elements 20 (e.g., memory elements 20-1, 20-2, 20-3, etc.) that store bits for controlling the pass transistors may be configured to receive one of multiple power supply voltage signals (see, FIG. 5). As shown in FIG. 5, memory element 20 (sometimes referred to as a memory cell) may include a latch portion formed from cross-coupled inverters INV1 and INV2 and at least one access transistor 204. Inverter INV1 may include a p-channel transistor P1 and an n-channel transistor N1 coupled in series between first power supply line 200 and ground power supply line 202 (e.g., a power supply line on which ground power supply voltage Vss is provided). Similarly, inverter INV2 may include a p-channel transistor P2 and an n-channel transistor N2 coupled in series between power supply lines 200 and 202.

Inverters INV1 and INV2 may each have an input and an output. The output of INV1 may be coupled to the input of INV2 and may serve as a first internal data storage node X for memory cell 20. The output of INV2 may be coupled to the input of INV1 and may serve as a second internal data storage node Y for memory cell 20. Cross-coupled inverters INV1 and INV2 connected in this way may be used to store a single bit of data. Data storage node X may serve as a true data storage node, whereas data storage node Y may serve as a complement data storage node (e.g., nodes X and Y store true and complement versions of a data bit that is loaded into cell 20). When storage node X is high, storage node Y is driven low. When storage node Y is low, storage node Y is driven high.

Access transistor 204 may be used to load a desired data value into the latch/storage portion of cell 20. In particular, access transistor 204 may have a first source-drain terminal that receives a data signal from a write driver circuit (not shown), a second source-drain terminal that is coupled to internal data storage node X, and a gate terminal that receives an address signal Addr from a corresponding address line. A high voltage signal may be presented at the first source-drain terminal of transistor 204 to load a logic "1" into memory cell 20 (e.g., to force node X high and to force node Y low). A low voltage signal may be presented at the first source-drain terminal of transistor 204 to load a logic "0" into memory cell 20 (e.g., to force node X low and to force node Y high). Access transistor 204 is enabled during write operations by asserting address signal Addr. Access transistor 204 may therefore sometimes be referred to as an address transistor.

Memory cell 20 of the type described in connection with FIG. 5 is merely illustrative. If desired, memory cell 20 may include more than one access transistor, a read circuit for reading the stored data bit, more than two cross-coupled inverters, and other control circuitry. Memory cell 20 may have an output 205 that is coupled to internal data storage node Y. Output 205 of memory cell 20 may be coupled to the gate of a corresponding pass transistor 110 (see, FIG. 3). Memory cell 20 may be configured in a first state during which output 205 is driven low to turn off the associated n-channel pass transistor (e.g., output 205 is driven to Vss). Memory cell 20 may also be configured in a second state during which output 205 is driven high to turn on the associated re-channel pass transistor (e.g., output 205 is driven to the voltage level on power supply line 200).

Memory cell power supply line 200 may be coupled to switching circuitry such as a multiplexing circuit 210. Multiplexer 210 may have a first (0) input that is coupled to a first power supply line 216-1, a second (1) input that is coupled to a second power supply line 216-2, a control input that receives a control bit from storage element 212, and an output that is coupled to memory cell power supply line 200.

Power supply lines 216-1 and 216-2 may be coupled to a voltage regulator 214. Voltage regulator 214 may receive an external power supply signal Vcc_ext from pin 14 and may be used to supply a first regulated positive power supply voltage Vcchg1 onto line 216-1 and to supply a second regulated positive power supply voltage Vcchg2 onto line 216-2. Voltage regulator 214 may be a series pass voltage regulator, a shunt voltage regulator, a step-down series switch regulator, a step-up shunt switch regulator, a temperature independent voltage regulator such as a bandgap reference, or other types of voltage regulating circuits.

Voltage Vcchg1 may be at least greater than the nominal power supply voltage Vcc (i.e., a nominal voltage that powers the majority of the core logic circuitry on device 10). Portions of integrated circuit 10, such as the main centrally located logic on the device, may be powered at Vcc to conserve power. For example, the centrally located logic on the integrated circuit may be powered at a voltage Vcc of 0.85 V. As an example, Vcchg1 may be at least a threshold voltage greater than Vcc to serve as an overdrive control voltage. Voltage Vcchg2 may be less than Vcchg1. As an example, Vcchg2 may be less than Vcchg1 but greater than core power supply voltage Vcc. As another example, Vcchg2 is equal to Vcc. Doing so may reduce the number of power supply voltages that needs to be generated and distributed on device 10. As yet another example, Vcchg2 is less than Vcc but greater than Vss.

Multiplexer 210 may be configured to route power supply signals from a selected one of its input to its output depending on the value of a control bit stored in element 212. Storage element 212 may be a volatile memory element (e.g., a CRAM cell loaded with configuration data, etc.) or a nonvolatile memory element (e.g., fuses, antifuses, electrically-programmable read-only memory elements, etc.). Storage element 212 may be powered using Vcchg1. When element 212 is programmed to store a low data bit, memory cell power supply line 200 may be driven to Vcchg1. When element 212 is programmed to store a high data bit, memory cell power supply line 200 may be driven to Vcchg2. It may be desirable for pass transistors selected to operate in low power mode to receive gate control signals from memory cells 20 that are powered using Vcchg2, whereas it may be desirable for pass transistors selected to operate in high speed mode to receive gate control signals from memory cells 20 that powered using Vcchg1.

In general, memory cell 20 with switchable power supply voltages can be used to power any pass transistor in multiplexers 105 and 105' of FIG. 4 or other programmable circuitry on device 10. In the arrangement of FIG. 3, when receiving multiplexer 105 is powered using boosted Vcchg1 in high speed mode, routing wire 104 and internal node 115 in multiplexer 105 are capable of switching full rails (e.g., signals propagating along path 104 and through multiplexer 105 are capable of being driven all the way down to Vss and all the way up to Vcc). When receiving multiplexer 105 is powered using the lower Vcchg2 in reduced power mode, signals propagating along routing wire 104 are still capable of swing full fail but signals at the internal nodes of multiplexer 105 only swing to a maximum level of (Vcchg2-Vtn), which may be less than Vcc (e.g., signals passing through multiplexer 105 may not swing full rail).

In the arrangement of FIG. 4, when the driving multiplexer 105' and receiving multiplexer 105 are powered using elevated Vcchg1, all signals being conveyed through the routing and switching circuitry are swinging full rail. Consider a second scenario during which multiplexer 105' is powered using Vccgh1 while receiving multiplexer 105 is powered using reduced Vcchg2, signals on routing wire 104 are still capable of swinging rail-to-rail but signals at the internal nodes of multiplexer 105 may not swing full rail due to the threshold voltage drop.

Consider a third scenario during which multiplexer 105' is powered using Vccgh2 while receiving multiplexer 105 is powered using Vcchg1, signals on routing wire 104 may not swing full rail due to the threshold voltage drop but the internal nodes of multiplexer 105 may swing full. This configuration may provide more power savings compared to the second scenario since capacitive switching at routing wire 104 is reduced.

Consider a fourth scenario during which multiplexers 105 and 105' are powered using Vccgh2, the signals on wire 104 and the signals at internal node 115 of multiplexer 105 do not swing rail-to-rail due to the threshold voltage drop. This configuration may provide even more power savings compared to the third scenario since capacitive switching at wire 104 and at the internal node of multiplexer 105 have been reduced.

These arrangements in which the multiplexing circuits are powered using a selected one of two power supply voltages are merely illustrative and do not serve to limit the scope of the present invention. If desired, each memory cell 20 may be powered using at least three different power supply voltages, at least four different power supply voltages, etc.

Figure 6:
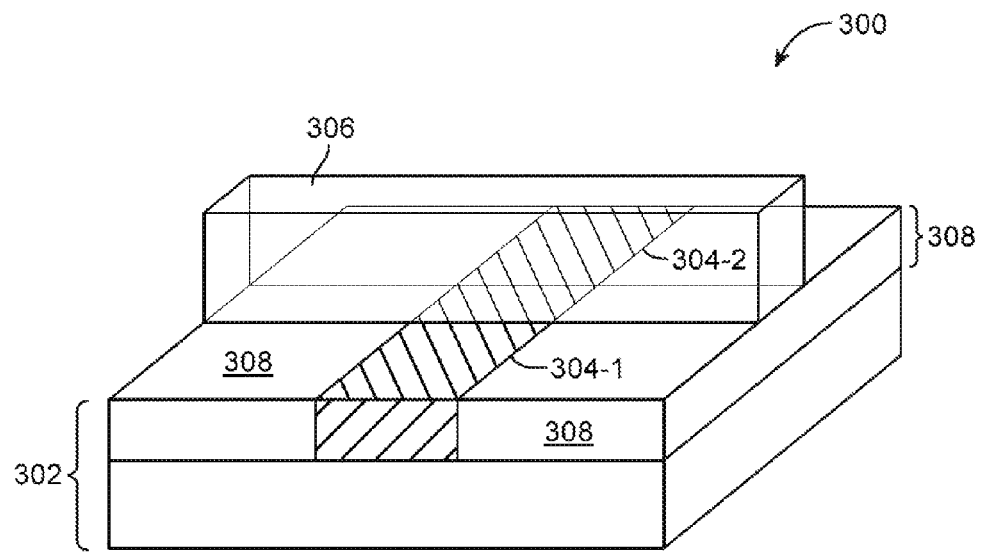
FIG. 6 is a perspective view of an illustrative planar transistor in accordance with an embodiment of the present invention.

Each pass transistor on device 10 may be implemented as a planar transistor such as planar transistor 300 of FIG. 6. Transistor 300 may be formed in a semiconductor substrate 302 (e.g., a p-type substrate). A conductive gate structure 306 may be disposed on substrate 302. Oxide definition (or diffusion) regions 304-1 and 304-2 may be formed on each side of gate structure 306 in the surface of substrate 302. Regions 304-1 and 304-2 may serve as source-drain regions for transistor 300. The portion of substrate 302 that lies directly beneath gate conductor 306 and between regions 304-1 and 304-2 may serve as the channel of transistor 300. Areas in substrate 302 that are not transistor diffusion or channel regions may be occupied by shallow trench isolation structures 308 that are filled with dielectric material such as silicon oxide.

Figure 7:
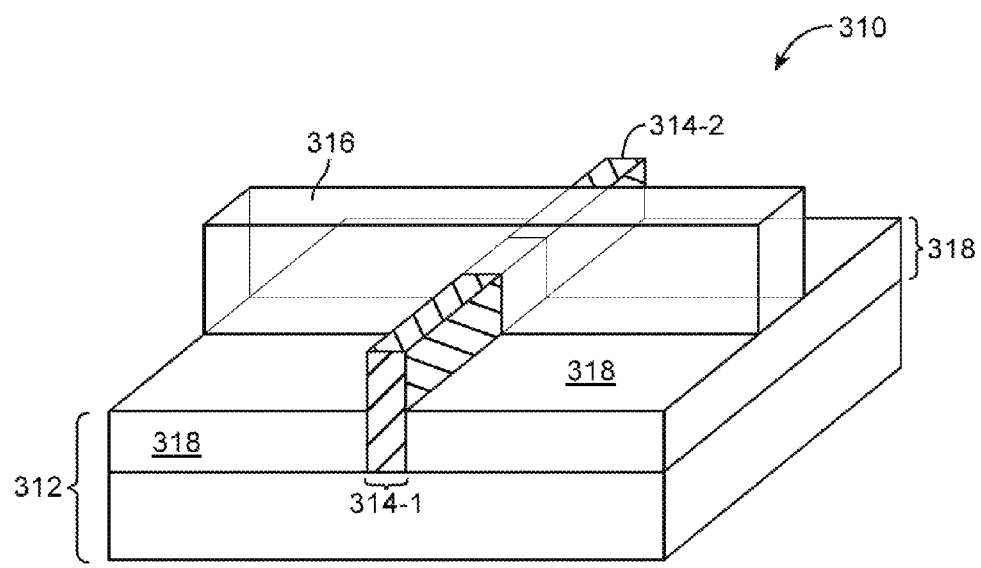
FIG. 7 is a perspective view of an illustrative non-planar transistor in accordance with an embodiment of the present invention.

In another suitable arrangement, each pass transistor on device 10 may be implemented as a nonplanar transistor such as nonplanar transistor 310 of FIG. 7. Transistor 310 may be formed on a semiconductor substrate 312. As shown in FIG. 7, transistor 310 may have a fin-shaped member that is integral with substrate 312 and that protrudes from the surface of substrate 312. A conductive gate structure 315 is disposed over substrate 312 and wraps around a portion of the protruding fin member. The portion of the fin that is directly in contact with gate structure 315 may serve as the channel region of transistor 310, whereas portions of the fin member on either side of gate 316 (e.g., fin portions 314-1 and 314-2) may serve as source-drain regions for transistor 310. Areas in substrate 312 that are not transistor diffusion or channel regions may be occupied by shallow trench isolation structures 318 that are filled with dielectric material such as silicon oxide. Transistor 310 formed in this way is therefore sometimes referred to as a Fin field effect transistor (FinFET).

Planar transistors of the type shown in FIG. 6 can be further adjusted for performance and power savings by adjusting a back gate (or bulk) voltage signal. Doing so changes the threshold voltage of the pass transistor, which directly affects the delay and leakage characteristics associated with the pass transistor. Nonplanar transistors, however, may not be provided with any back gate adjustment mechanisms. As a result, only changes to the voltage level at the gate terminals can be used to adjust for performance and power tradeoffs.

Figure 8A:
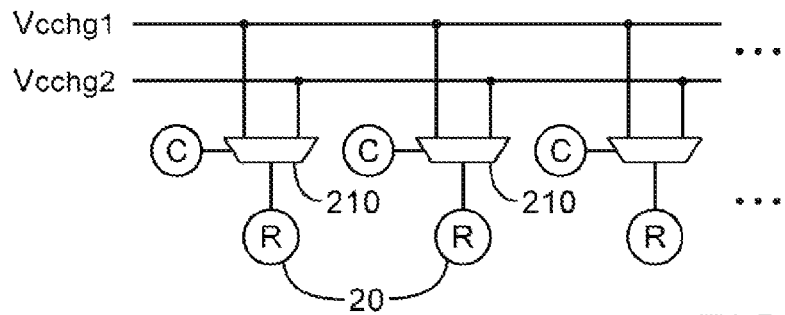
FIGS. 8A, 8B, and 8C are diagrams showing how power supply voltages may be supplied to memory elements using different levels of granularity in accordance with an embodiment of the present invention.
Figure 8B:
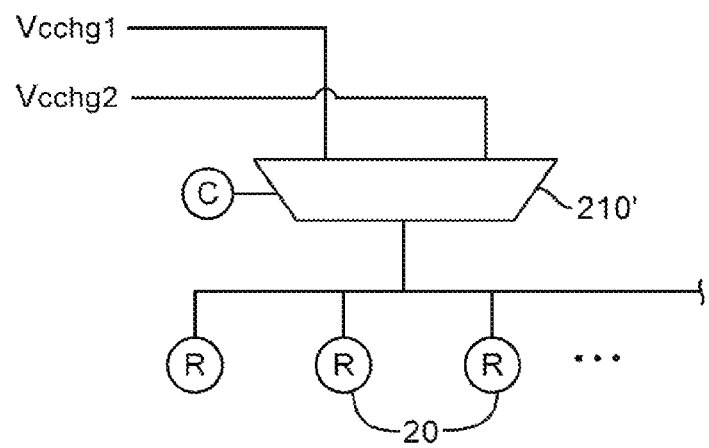

Device 10 may be configured to provide different levels of programmable overdriving granularity. Once selected, the level of granularity for device 10 is fixed (i.e., cannot be changed after manufacture). FIG. 8A shows a very fine level of granularity for which each memory cell 20 is controlled by a dedicated multiplexer 210 (e.g., every cell 20 is coupled to its own multiplexer 210). FIG. 8B shows an intermediate level of granularity for which a group of memory cells 20 receives power supply signals from a shared multiplexer 210'. Sharing multiplexers 210' in this way receives routing complexity at the expense of reduced programmability.

Figure 8C:
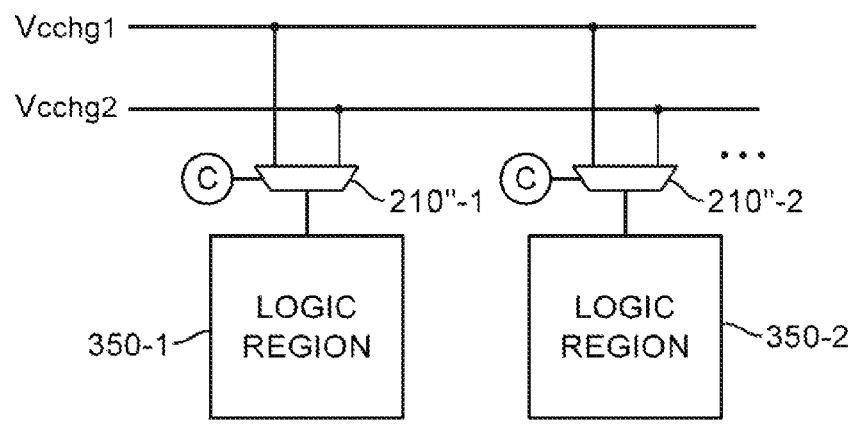

FIG. 8C shows a relatively coarse level of granularity for which each logic region 350 on device 10 is controlled using an associated multiplexer 210" (e.g., each logic region 350 is coupled to its own multiplexer 210"). In the example of FIG. 8C, each pass transistor in logic region 350-1 may be powered by the signal provided at the output of multiplexer 210"-1, whereas each pass transistor in logic region 350-2 may be powered by the signal provided at the output of multiplexer 210"-2. Doing so allows particular logic regions to operate in the high speed mode awhile other logic regions are operating at the low power mode.

In other embodiments, every memory cell 20 on device 10 may be coupled to a common global multiplexing circuit. In such scenarios, the entire device operates either in a global high speed mode or a global low power mode. If desired, other levels of overdriving granularity may be implemented on device 10.

Figure 9:
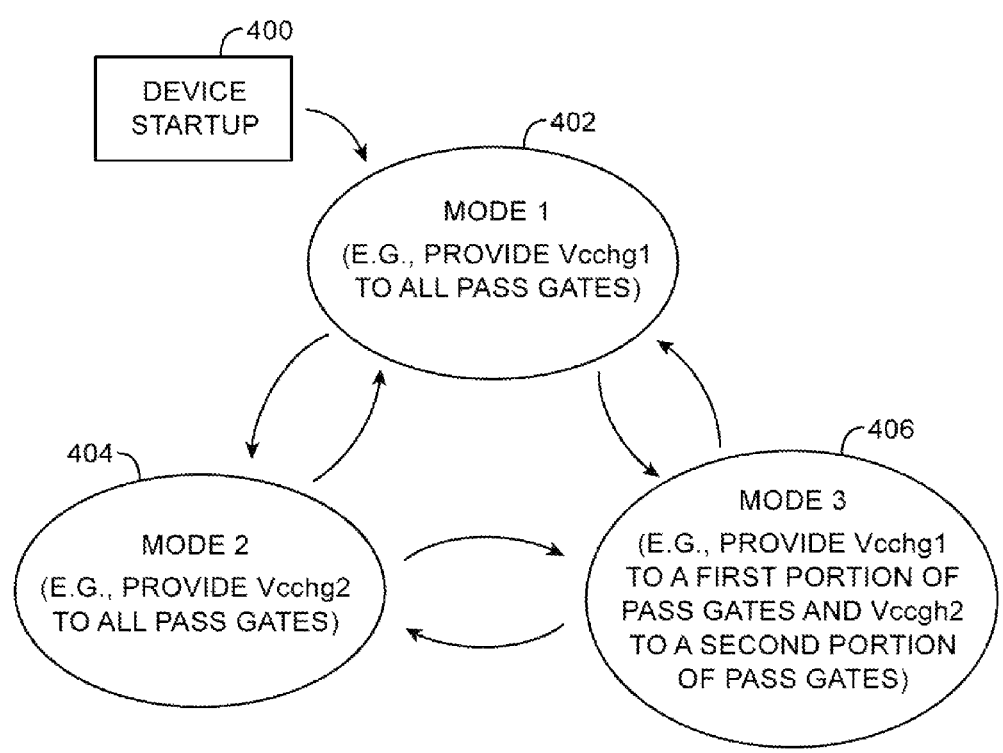
FIG. 9 is a diagram showing different modes for operating an integrated circuit with programmable overdrive capabilities in accordance with an embodiment of the present invention.

FIG. 9 is a diagram showing different operating modes of device 10 that is provided with programmable overdrive capabilities. After device startup 400, device 10 may be operated in a first mode 402 during which all enabled pass transistors receive the overdrive voltage Vcchg1. In the first mode, device 10 offers the highest performance but consumes the highest amount of power. Device 10 may also be operated in a second mode 404 during which all enabled pass transistors receive the reduced voltage Vcchg2. In the second mode, device 10 offers the highest power savings but the lowest performance. If desired, device 10 may also be operated in a third mode 406 during which a first portion of the pass transistors is powered using Vcchg1 and a second portion of the pass transistors is powered using Vcchg2. The relative size of the first portion to the second portion may be optimized depending on the power and performance requirements of the user application.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
a memory element having an output terminal and a power supply terminal;
logic circuitry that receives a static control voltage from the output terminal of the memory element;
a first power supply line on which a first control voltage is provided;
a second power supply line on which a second control voltage is provided; and
switching circuitry that routes a selected one of the first and second control voltages to the power supply terminal of the memory element, wherein the first control voltage overdrives the logic circuitry, wherein the second control voltage does not overdrive the logic circuitry, and wherein the second control voltage has a voltage level that is less than the first power supply level.

2. The integrated circuit defined in claim 1, further comprising:
a driver circuit that outputs a signal that swings between first and second power supply voltage levels, wherein the driver circuit is coupled to the logic circuitry, wherein the first power supply voltage level is greater than the second power supply voltage level, and wherein the first control voltage has a voltage level is at least greater than the first power supply voltage level.

3. The integrated circuit defined in claim 2, wherein the logic circuitry comprises a pass transistor having a gate terminal that receives the static control voltage from the output terminal of the memory element, wherein the pass transistor has an associated threshold voltage level, and wherein the first control voltage is at least one threshold voltage level greater than the first power supply voltage level.

4. The integrated circuit defined in claim 3, wherein the pass transistor comprises a nonplanar transistor.

5. The integrated circuit defined in claim 1, wherein the memory element comprises a volatile memory cell.

6. The integrated circuit defined in claim 1, wherein the switching circuitry comprises a multiplexer having a first input coupled to the first power supply line, a second input coupled to the second power supply line, a control input, and an output that is coupled to the power supply terminal of the memory element.

7. The integrated circuit defined in claim 6, further comprising:
 a storage element that stores a control data bit that is received by the control input of the multiplexer, wherein the storage element has a power supply terminal that receives the first control voltage.

8. A method of operating an integrated circuit that includes a driver circuit having an output, a routing path having first and second ends, a first multiplexing circuit that is coupled between the output of the driver circuit and the first end of the routing path, and a second multiplexing circuit that is coupled to the second end of the routing path, the method comprising:
 with the driver circuit, outputting a signal that swings between first and second power supply voltage levels;
 during a first mode, overdriving a pass transistor in the first multiplexing circuit by controlling that pass transistor with an overdrive voltage having a voltage level that is at least greater than the first and second power supply voltage levels; and
 during the first mode, controlling a pass transistor in the second multiplexing circuit with a reduced voltage that is no greater than the first power supply voltage level.

9. The method defined in claim 8, further comprising:
 during a second mode, controlling the pass transistor in the first multiplexing circuit with the reduced voltage; and
 during the second mode, overdriving the pass transistor in the second multiplexing circuit by controlling that pass transistor with the overdrive voltage.

10. The method defined in claim 9, further comprising:
 during a third mode, controlling the pass transistor in the first multiplexing circuit with the reduced voltage; and
 during the third mode, controlling the pass transistor in the second multiplexing circuit with the reduced voltage.

11. The method defined in claim 10, further comprising:
 during a fourth mode, overdriving the pass transistor in the first multiplexing circuit by controlling that pass transistor with the overdrive voltage; and
 during the fourth mode, overdriving the pass transistor in the second multiplexing circuit by controlling that pass transistor with the overdrive voltage.

12. The method defined in claim 8, wherein the pass transistors in the first and second multiplexing circuits have an associated threshold voltage level, wherein the first power supply voltage level is greater than the second power supply voltage level, and wherein overdriving the pass transistor in the first multiplexing circuit comprises providing the overdrive voltage that is at least one threshold voltage level greater than the first power supply voltage level to that pass transistor.

13. The method defined in claim 12, wherein controlling the pass transistor in the second multiplexing circuit comprises providing the reduced voltage having a voltage level that is less than the first power supply voltage level to that pass transistor.

14. A method of operating an integrated circuit having a routing circuit and a receiver circuit coupled to the routing circuit, comprising:
 during a first operating mode, overdriving the routing circuit, wherein the routing circuit comprising a pass transistor having a gate and wherein overdriving the routing circuit comprises providing an elevated voltage to the gate of the pass transistor;
 during a second operating mode, not overdriving the routing circuit;
 with the receiver circuit, level shifting a signal passing through the routing circuit during the second operating mode;
 with a driver circuit, driving a signal that swings between a ground power supply voltage level and a positive power supply voltage level, wherein not overdriving the routing circuit comprises providing a reduced voltage having a voltage level that is equal to the positive power supply voltage level; and
 propagating the signal through the pass transistor, wherein the pass transistor has an associated threshold voltage level, and wherein the elevated voltage has a voltage level that is at least greater than the sum of the positive power supply voltage level and the threshold voltage level.

\* \* \* \* \*